US006643166B1

United States Patent
Ting et al.

(10) Patent No.: US 6,643,166 B1
(45) Date of Patent: Nov. 4, 2003

(54) LOW POWER SRAM REDUNDANCY REPAIR SCHEME

(75) Inventors: Tah-Kang Joseph Ting, Hsinchu (TW); Bor-Doou Rong, Chupei (TW); Shi-Huei Liu, Taipei (TW)

(73) Assignee: Etron Technology, Inc., Hsin-Chu (TW)

( * ) Notice: Subject to any disclaimer, the term of this patent is extended or adjusted under 35 U.S.C. 154(b) by 36 days.

(21) Appl. No.: 09/992,518

(22) Filed: Nov. 14, 2001

(51) Int. Cl.[7] .............................................. G11C 11/00
(52) U.S. Cl. ........................ 365/154; 365/200; 365/201
(58) Field of Search ................................ 365/201, 200, 365/154, 189.01

(56) References Cited

U.S. PATENT DOCUMENTS 5,132,929 A * 7/1992 Ochii ......................... 365/201
5,703,816 A 12/1997 Nam et al. .................. 365/200
6,097,647 A 8/2000 Zagar et al. ................. 365/201
6,175,938 B1 1/2001 Hsu ............................ 714/718
6,333,877 B1 * 12/2001 Nagaoka et al. ............ 365/200

* cited by examiner

Primary Examiner—Hoai Ho
(74) Attorney, Agent, or Firm—George O. Saile; Stephen B. Ackerman; Douglas B. Schnabel

(57) ABSTRACT

A particular SRAM cell power scheme is disclosed. It ensures that overall chip power is reduced, by eliminating power contributed by defective memory array cells. The VSS path to the 6T memory cell is controlled via NMOS transistors. A VSS Enable (VSSEN) circuit is used to decode which block has a defect. Further, the VSSEN signal can be used to selectively disable a defective cell, or block of cells, by cutting the VSS path via turning off the NMOS transistor, in the normal cell region, and the VSSEN signal can be used to selectively enable a redundant cell, or block of cells, by turning on the VSS path via turning on the NMOS transistor, in the redundant cell region.

13 Claims, 4 Drawing Sheets

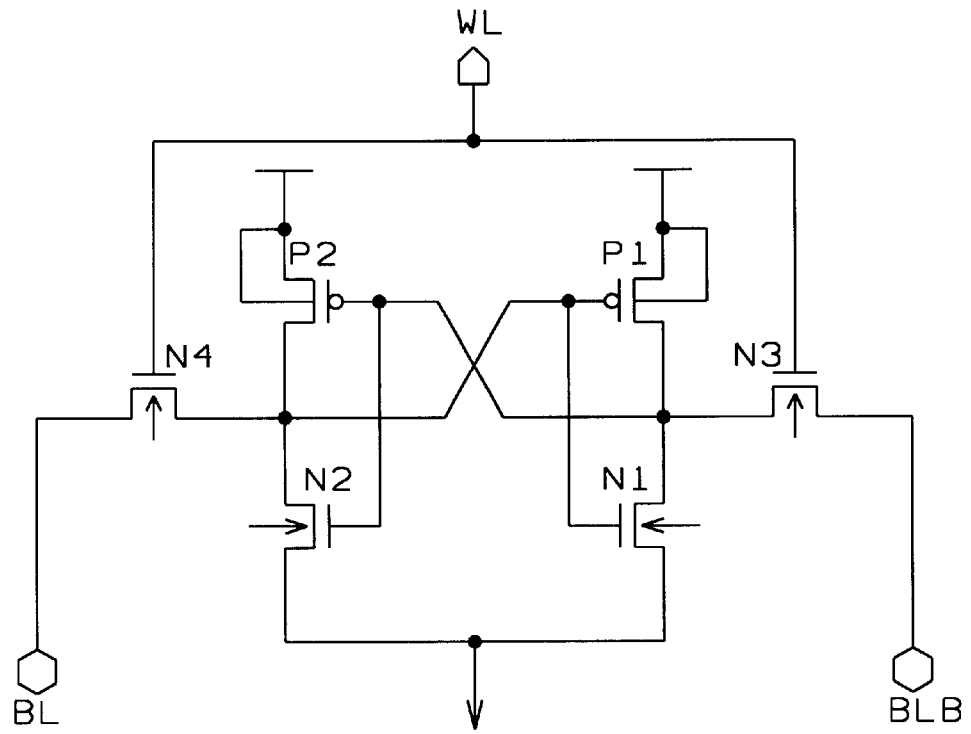
*FIG. 1 – Prior Art*
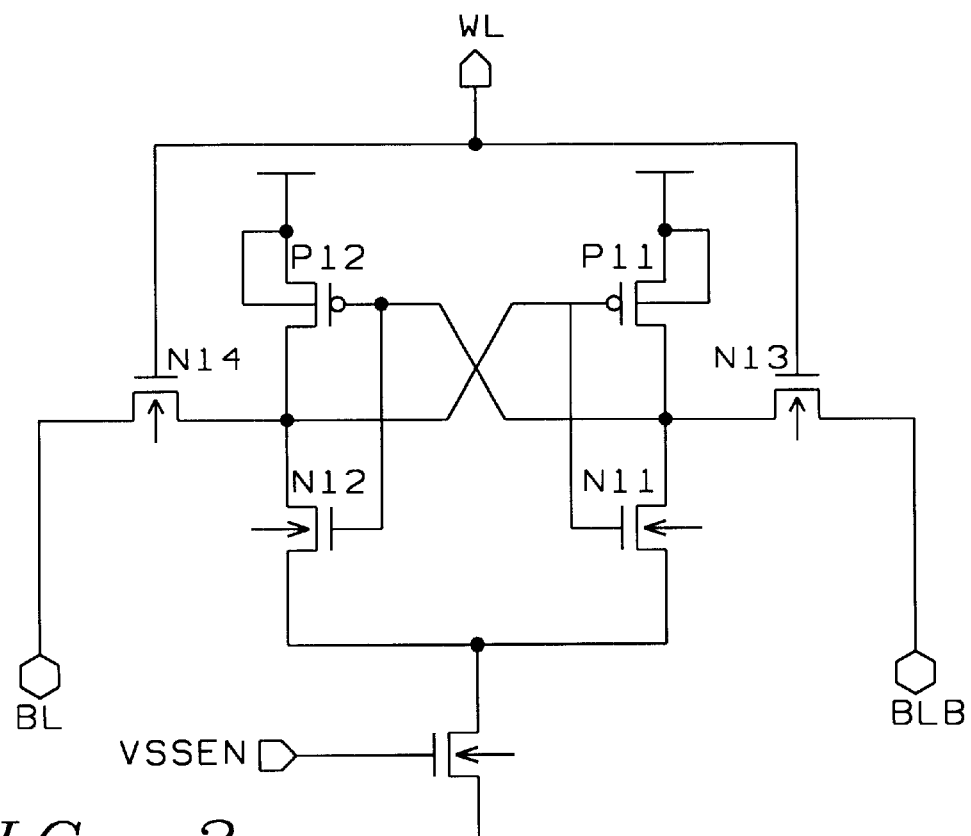
*FIG. 2*

LOW POWER SRAM REDUNDANCY REPAIR SCHEME

BACKGROUND OF THE INVENTION

1. Field of the Invention

The present invention generally relates to an SRAM (Static Random Access Memory), and more particularly to an SRAM-cell power scheme.

2. Description of the Prior Art

Major design efforts have been directed at minimizing the power consumption of memory array cells. A number of solutions have been proposed, including methods to reduce overall chip power by reducing power contributed by defective memory cells.

U.S. Pat. No. 5,703,816 (Nam et al.) describes a method to reduce standby current in failed cells in an SRAM by replacing failed memory cell columns with redundant columns before packaging. A means of turning off the pre-charge circuit transistor pair that supplies current to the bit line pair, and also turning off the cell power line circuit for the defective column of memory array cells, is provided.

U.S. Pat. No. 6,175,938 (Hsu) discloses a scheme for reduction of standby current induced by process defects. After failing cells are replaced with redundant cells, polysilicon fuses in the VDD path for each bit line are disconnected to reduce standby current of failed cells.

U.S. Pat. No. 6,097,647 (Zagar et al.) discloses a method to electrically isolate an inoperable section of memory cells from both power and ground. This allows the remaining functional sub arrays to be utilized and eliminates the extra current draw of the defective memory cells.

Such low power memory array cells are based on a static CMOS flip-flop circuit, using a pair of cross-coupled inverters as the storage element. The steady-state power consumption of the CMOS flip-flop is naturally very small, being set by junction leakage currents. It is in this circuit, comprising the memory array cell, where power usage is critical. For a low power spec, some failing cells produce enough current for the design to exceed the chip's power spec.

What is needed is a mechanism by which defective cells can be selectively disabled, thereby reducing leakage current and overall chip power.

SUMMARY OF THE INVENTION

It is therefore an object of the present invention to provide an efficient mechanism to minimize current contributed by failing cells in low power SRAM arrays.

It is a further object of the invention to provide a means for determining which cell or block of cells in an SRAM has a leakage path. These and other objects are achieved by an SRAM memory cell having a redundancy repair scheme, in which the SRAM memory cell has connections to an upper reference voltage and a lower reference voltage, and a means for disconnecting the SRAM memory cell from the lower reference voltage. The objects are also achieved by a method to reduce leakage current contributed by defective memory cells in an SRAM array. An SRAM is provided having a plurality of SRAM cells, each of the cells having a connection to an upper reference voltage and a lower reference voltage, testing the SRAM array for defective cells, replacing the defective cells with redundant good cells, and disconnecting the defective cells from the lower reference voltage, whereby the leakage from the defective cells is reduced, while leaving the remaining chip power scheme intact.

The lower reference voltage path is controlled by an enable signal (VSSEN), which is used to isolate defective cells under conditions indicated by array testing. This enable signal can also be used to decode which memory cells, or blocks of cells, are enabled and which defective cells are decoupled, from the low power SRAM. Gating off the path to the lower reference voltage in failing cells and replacing them with redundancy cells can reduce power contributed by defective cells. Failing redundancy cells can also be disabled, further reducing chip current and power. In this way, leakage current is minimized and overall chip power reduced.

BRIEF DESCRIPTION OF THE DRAWINGS

The foregoing and other objects, aspects, and advantages will be better understood from the following detailed description of a preferred embodiment of the invention, with reference to the drawings, in which:

FIG. 1 is a schematic of a standard 6T(6 Transistor) SRAM cell of the prior art.

FIG. 2 is a schematic of a 6T SRAM cell of the invention, with the proposed lower reference voltage enable signal (VSSEN).

DESCRIPTION OF THE PREFERRED EMBODIMENT

Referring to FIG. 1, a standard 6T SRAM cell is shown. For an 8M ultra low power SRAM, the standby current of the memory cell, when the word line is off, is less than 20 micro amps at 85C, and 1 to 2 micro amps at room temperature.

Access devices N3 and N4 provide a switchable path for data into and out of the cell. The word line select WL is held low except when the cell is to be accessed for reading or writing. Two column lines BL and BLB provide the data path. Word line and data selection is accomplished using decoders. Assume that a stored "1" is defined as the state in which the left side of the flip-flop is high; that is N2 is off.

Operation of the memory cell in FIG. 1 proceeds as follows. The word line WL, held low in standby, goes to the upper reference voltage, turning on N4 and N3. Writing is done by forcing either BL or BLB low, while the other remains high. To write a "1", BLB is forced low. The cell is designed so that the drain of N1 and the gate of N2 may be brought below the threshold voltage. N2 turns off and its drain voltage rises due to the currents from P2 and N4. N1 turns on and the word line may return to its low standby level, leaving the cell written to a one.

FIG. 2 shows a schematic of a 6T SRAM cell of the invention, with the proposed enable signal (VSSEN). VSSEN is held high and its NMOS transistor is conductive, when no defect is detected in the memory cell, enabling the cell to be included in memory. To read a "1", BL and BLB are initially high at the upper reference voltage (VCC).

When the cell is selected, current flows through N11 and N13 to the lower reference voltage (VSS) and through P12 and N14 to BL. N11 remains on. To read a "0", when the cell is selected, current flows through N12 and N14 to VSS and through P11 and N13 to BLB. N12 remains on. VSSEN is brought low and its NMOS transistor is nonconductive, when a defect is detected in the memory cell, disabling the cell from memory.

Figure 3:
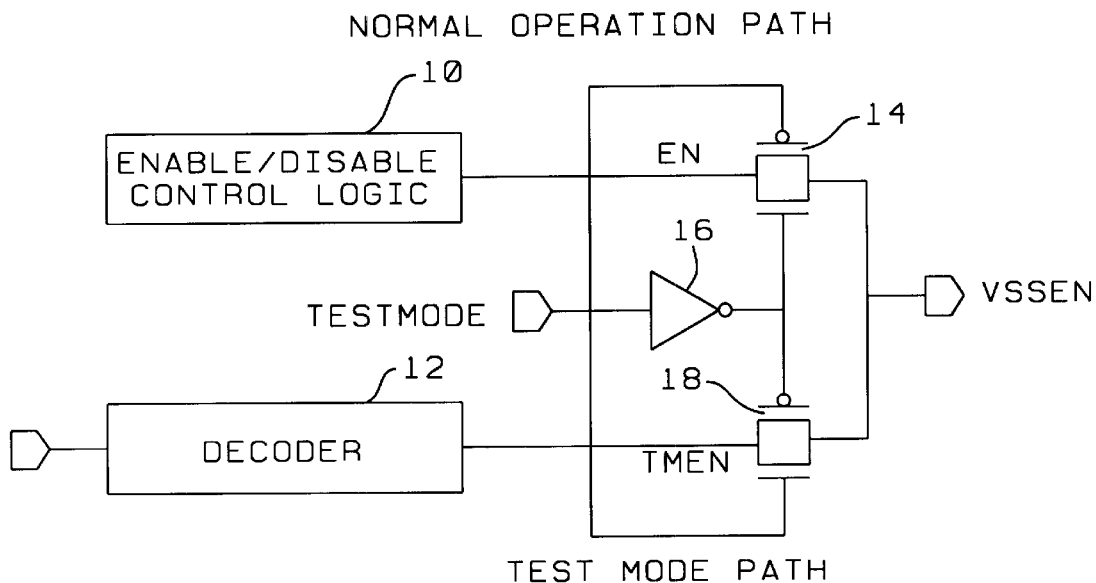
FIG. 3 is a block diagram of how the lower reference voltage enable signal (VSSEN) can be decoded to disable failing cells in the normal cell region and enable cells in the redundant cell region which are replacing the failing cells.

Memory arrays are typically tested after they have been manufactured to determine if any cells are defective. The prior art required the testing of an entire sub array, whereas this invention can be used on columns of bit line pairs. If during testing, a memory cell, or block of cells, was determined to be defective, an entire sub array would have to be replaced. Now only a single bit line pair column can be deleted. How this is achieved is illustrated in FIG. 3, where the decode of VSSEN is shown. The signal EN is the output of control logic 10 and is applied to the drain node of device 14. The signal TMEN is the output of decoder 12 and is applied to the drain node of device 18. The signal TEST-MODE is the input of inverter 16; the inverter output is applied to the gate nodes of devices 14 and 18. The source nodes of said devices are the signal VSSEN. If the current is found to exceed the current spec, the array cells are replaced if they are in the normal cell region and turned off if they are in the redundant cell region. In the normal cell region,, the signal EN is high except when the cell is being replaced by a redundant cell. In the redundant cell region, the signal EN is low except when the cell is being used to replace a defective cell.

Figure 4A:
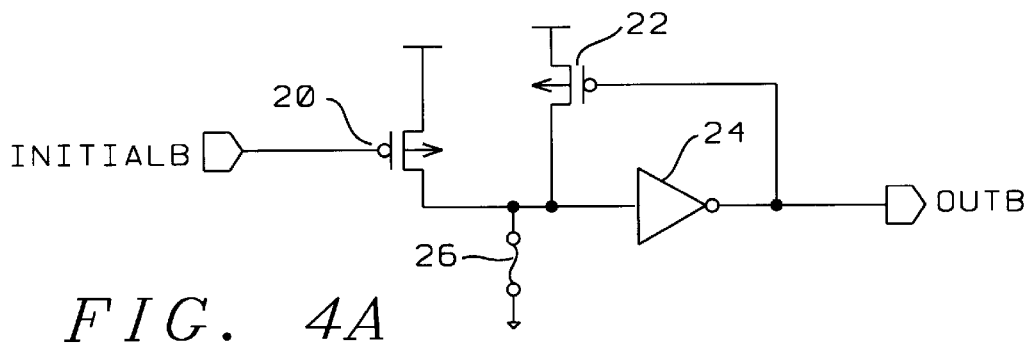
FIG. 4a is a schematic of how the enable/disable control logic is achieved for normal vs.
Figure 4B:
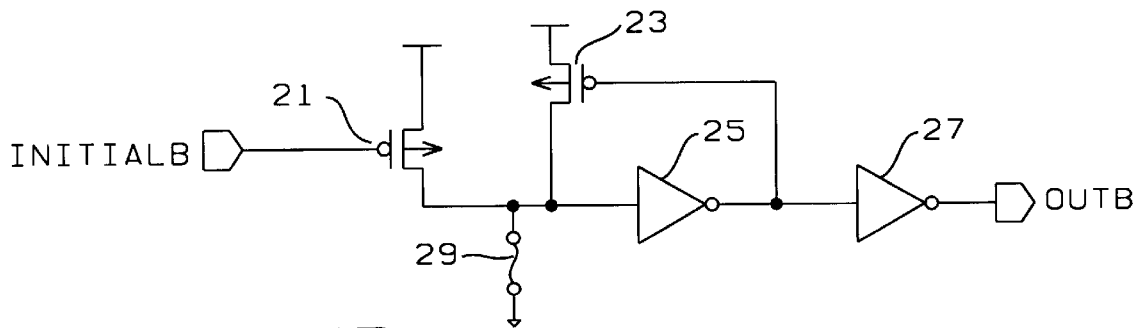
FIG. 4b redundant memory cells for a low power SRAM.

FIGS. 4a & 4b show how fuses are used to set OUTB and OUT levels respectively, thereby setting the level for the signal EN in FIG. 3. FIG. 4a shows the cells in the normal cell region will blow the fuse 26 to disable VSSEN low if the cells are defective. EN (OUTB for normal cells) is the output of inverter 24, which is also the gate node of device 22. The fuse 26 applied to the source of device 20 and the source of device 22 allows for the inversion of INITIALB onto EN, through inverter 24, if the cells are defective. FIG. 4b shows the cells in the redundant cell region, that are replacing the defective cells, will blow the, fuse 29 to enable the VSSEN high. EN (OUT for redundant cells) is the output of inverter 27. The input of inverter 27 is the output of inverter 25 and also the gate node of device 23. The fuse 29 applied to the source of device 21 and the source of device 23 allows for INITIALB to pass onto EN if the cells are to be used. In this way, the array cells which are not used are disabled and do not contribute to the standby current. The prior art requires the cutting of both power supply paths VDD and VSS. By cutting only the VSS path, as in this invention, fewer transistors are required, and thereby chip power and circuitry are minimized.

Figure 5:
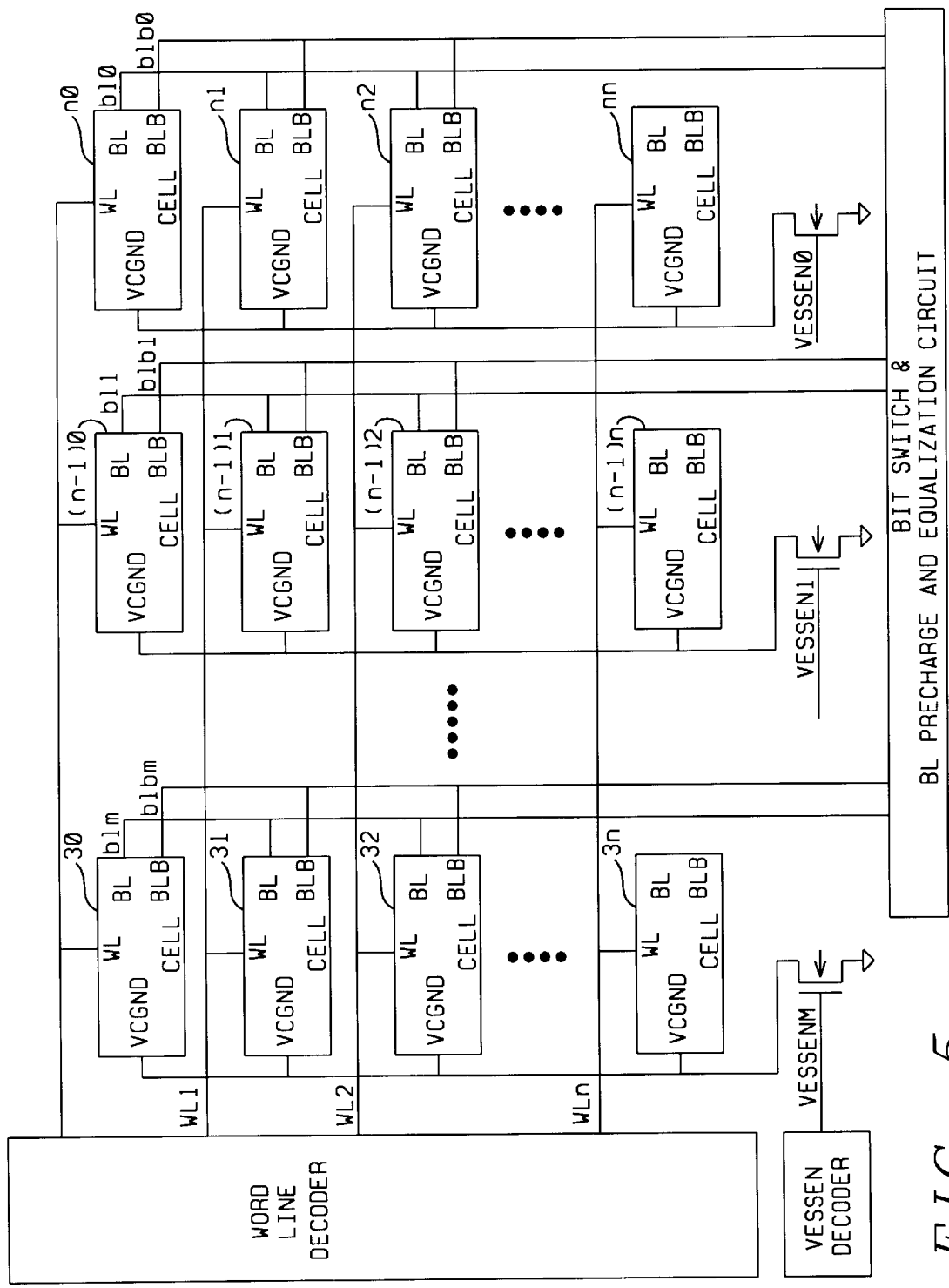
FIG. 5 is a diagram illustrating how the lower reference voltage enable signal (VSSEN) can be connected to multiple memory cells.

FIG. 5 shows that if a defective cell is found, the column of cells, containing the defective cell, is deleted from the array, and a redundant good column is added. In this way, the lower reference voltage enable signal (VSSEN) is connected to a column of memory cells, 30 through n0, making the invention much simpler than the prior art.

Figure 6:
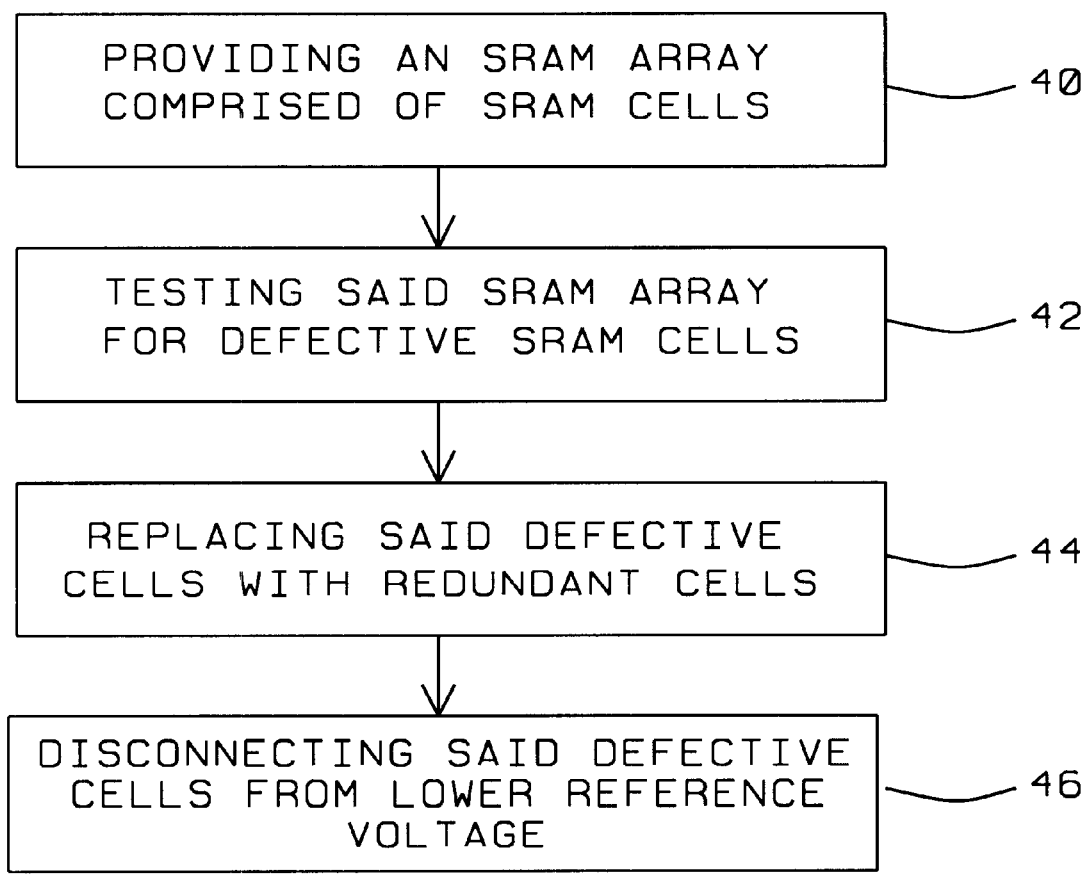
FIG. 6 is a diagram of the process flow of the invention.

The entire process flow of the invention function is illustrated in FIG. 6. With this invention, an SRAM is provided with a plurality of SRAM cells (40), each of the cells having a connection to an upper reference voltage and a lower reference voltage. The SRAM array is tested for defective cells (42), and defective cells are replaced with redundant good cells (44). The, defective cells are disconnected from the lower reference voltage (46). The leakage current from the defective cells is reduced, while leaving the remaining chip power scheme intact.

While the invention has been described in terms of the preferred embodiments, those skilled in the art will recognize that various changes in form and details may be made without departing from the spirit and scope of the invention. For example, the invention could be used for 4T(4 Transistor) SRAM cells, or other memory configurations for which VSS can be independently separated, as well as the 6T cell described above.

What is claimed is:

1. An SRAM memory cell having a redundancy repair scheme, comprising:

an SRAM memory cell having connections to an upper reference voltage and a lower reference voltage; and a means for disconnecting said SRAM memory cell from said lower reference voltage wherein said lower reference voltage is always connected to said SRAM memory cell during a test mode and wherein a fuse is blown such that said lower reference voltage is disconnected from said SRAM memory cell.

2. The SRAM memory cell of claim 1 further comprising an NMOS transistor between said SRAM memory cell and said lower reference voltage.

3. The SRAM memory cell of claim 2 wherein said NMOS transistor is controlled by an enable signal that is in an enable state in said test mode and is in a disable state when said fuse is blown.

4. An SRAM array having a redundancy repair scheme, comprising:

a plurality of SRAM memory cells having connections to an upper reference voltage and a lower reference voltage, and a means for disconnecting one or more of said SRAM memory cells from said lower reference voltage wherein said lower reference voltage is always connected to said SRAM memory cell during a test mode and wherein a fuse is blown such that said lower reference voltage is disconnected from said SRAM memory cell.

5. The SRAM array of claim 4 further comprising an NMOS transistor between each said SRAM memory cell and said lower reference voltage.

6. The SRAM array of claim 5 wherein said NMOS transistor is controlled by an enable signal that is in an enable state in said test mode and is in a disable state when said fuse is blown.

7. A method to reduce leakage current contributed by defective memory array cells in an SRAM array comprising:

providing an SRAM array comprising a plurality of SRAM cells (40), each of said cells having a connection to an upper reference voltage and a lower reference voltage;

testing said SRAM array for defective cells (42);

replacing said defective cells with redundant good cells (44); and disconnecting said defective cells from said lower reference voltage (4,6), whereby said leakage current from said defective cells is reduced, while leaving the remaining chip power scheme intact wherein said lower reference voltage is always connected to said cells during a test mode and wherein a fuse is blown such that said lower reference voltage is disconnected from said defective cells.

8. The method to reduce leakage current of claim 7 said cells are selectively tested during said test mode based on a decoder circuit.

9. The method to reduce leakage current of claim 8 cell current of said selected cells is tested in said test mode.

10. The method to reduce leakage current of claim 7 wherein said defective array cells are replaced if they are in the normal cell region.

11. The method to reduce leakage current of claim 7 wherein said defective array cells are disabled if they are in the redundant cell region.

12. The method to reduce leakage current of claim 7 wherein said step of disconnecting said defective cells comprises disconnecting a bit line column of said defective cells.

13. The method to reduce leakage current of claim 7 wherein a column of said memory array cells is controlled by selected in said test mode.

* * * * *